(12) United States Patent
Huang

(10) Patent No.: US 8,013,658 B2
(45) Date of Patent: Sep. 6, 2011

(54) CIRCUIT FOR CONTROLLING TIME SEQUENCE

(75) Inventor: Yong-Zhao Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 43 days.

(21) Appl. No.: 12/610,363

(22) Filed: Nov. 2, 2009

(65) Prior Publication Data

US 2011/0068850 A1 Mar. 24, 2011

(30) Foreign Application Priority Data

Sep. 23, 2009 (CN) .......................... 2009 1 0307515

(51) Int. Cl.
*H03K 17/296* (2006.01)
*H03K 17/60* (2006.01)

(52) U.S. Cl. ......... 327/392; 327/398; 327/432; 327/478

(58) Field of Classification Search ........................ None
See application file for complete search history.

(56) References Cited

U.S. PATENT DOCUMENTS

| | | | | |
|---|---|---|---|---|
| 3,299,315 A * | 1/1967 | McMillan | ...................... | 315/367 |
| 4,234,805 A * | 11/1980 | Carlsen, II | .................... | 327/483 |
| 4,461,960 A * | 7/1984 | Yasunaga | ..................... | 327/411 |
| 5,018,366 A * | 5/1991 | Tanaka et al. | ................ | 62/228.5 |
| 6,300,669 B1 * | 10/2001 | Kinoshita | ..................... | 257/566 |
| 6,340,907 B2 * | 1/2002 | Aoki | ............................. | 327/206 |
| 7,205,808 B2 * | 4/2007 | You et al. | ..................... | 327/198 |
| 7,586,346 B2 * | 9/2009 | Xiong | ............................ | 327/143 |
| 2006/0158236 A1* | 7/2006 | Kozawa | ........................ | 327/205 |
| 2008/0116940 A1* | 5/2008 | Chuang | ........................... | 327/34 |

* cited by examiner

*Primary Examiner* — Tuan T Lam
(74) *Attorney, Agent, or Firm* — Altis Law Group, Inc.

(57) ABSTRACT

A circuit for controlling time sequence of an electronic device, the circuit comprises a delay unit to receive a first control signal, a first switch unit connected to the delay unit to receive the first control signal after a rising edge of the first control signal, a second switch unit to promptly receive the first control signal in response to a falling edge of the first control signal, and a voltage output unit connected to the first and second switch units. The voltage output unit is selectively controlled by the first or the second switch unit to output a second or a third control signal to turn on or off the electronic device.

9 Claims, 2 Drawing Sheets

CIRCUIT FOR CONTROLLING TIME SEQUENCE

BACKGROUND

1. Technical Field

The present disclosure relates to circuits, and particularly to a circuit for controlling a time sequence of a device.

2. Description of Related Art

Operation of an electronic device or a component, such as a computer motherboard, may have special time sequence requirements for controlling power during turning on or off the computer.

In order to satisfy these requirements, a special time sequence controlling chip is used, such as an IT8282M. However, the special time sequence controlling chip is expensive.

DETAILED DESCRIPTION

Figure 1:
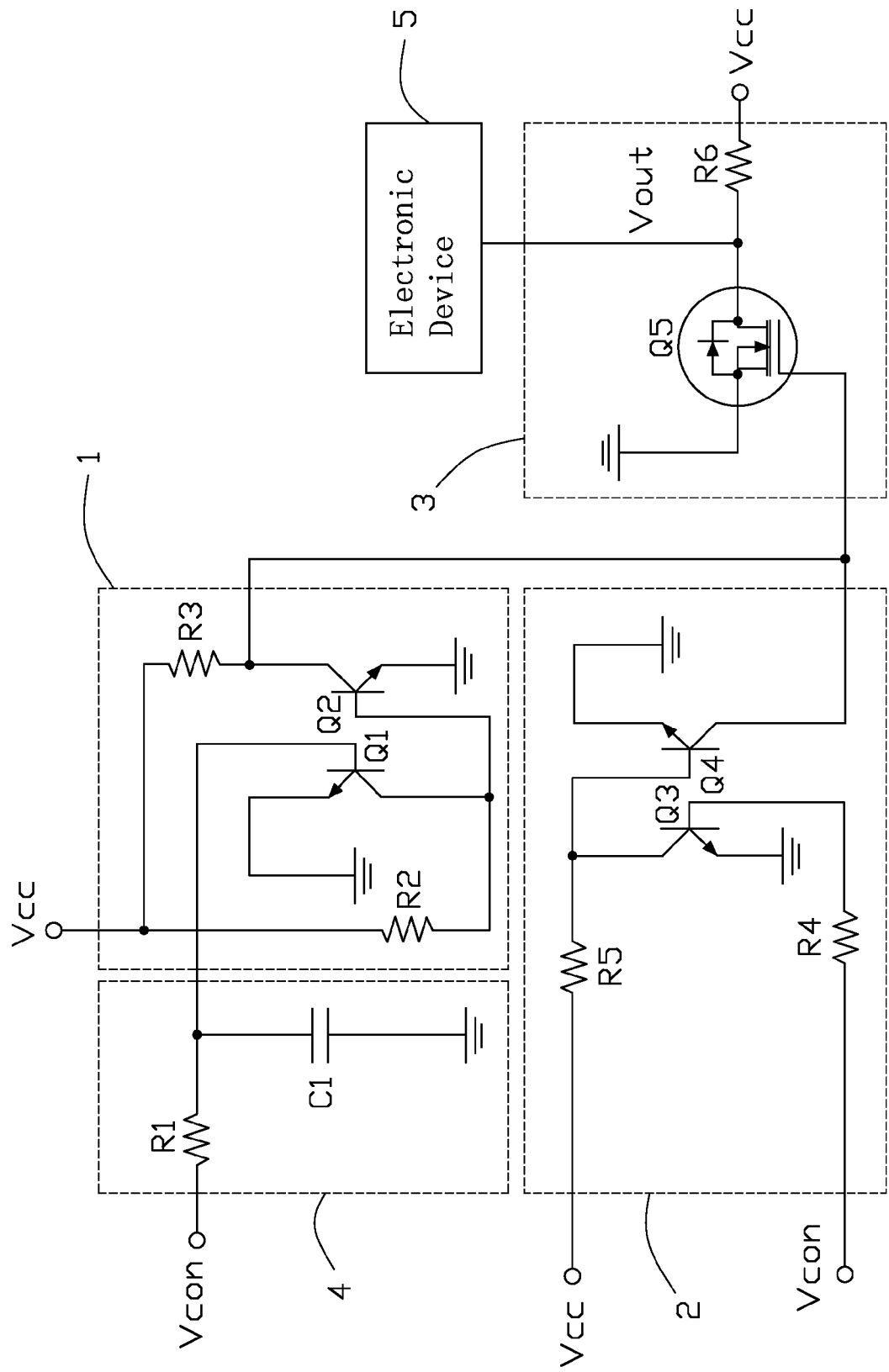
FIG. 1 is a circuit diagram of an exemplary embodiment of a circuit for controlling a time sequence.

Referring to FIG. 1, an exemplary embodiment of a circuit is disclosed for controlling a time sequence of an electronic device 5, such as a computer motherboard, during turning on or off the electronic device 5. The circuit includes a delay unit 4, a first switch unit 1, a second switch unit 2, and a voltage output unit 3.

The delay unit 4 includes a resistor R1 and a capacitor C1. A first end of the resistor R1 is connected to an external circuit (not shown) to receive a first control signal Vcon. A second end of the resistor R1 is grounded via the capacitor C1.

The first switch unit 1 includes two npn transistors Q1 and Q2, and two resistors R2 and R3. A collector of the transistor Q1 is connected to a power supply Vcc via the resistor R2, an emitter of the transistor Q1 is grounded, and a base of the transistor Q1 is connected to a node between the resistor R1 and the capacitor C1. A base of the transistor Q2 is connected to the collector of the transistor Q1, an emitter of the transistor Q2 is grounded, and a collector of the transistor Q2 is connected to the power supply Vcc via the resistor R3.

The second switch unit 2 includes two npn transistors Q3 and Q4, and two resistors R4 and R5. A first end of the resistor R4 is connected to the external circuit to receive the first control signal Vcon, a second end of the resistor R4 is connected to a base of the transistor Q3. An emitter of the transistor Q3 is grounded, and a collector of the npn transistor Q3 is connected to the power supply Vcc via the resistor R5. A base of the transistor Q4 is connected to the collector of the transistor Q3, a collector of the transistor Q4 is connected to the collector of the transistor Q2 of the first switch 1, and an emitter of the npn transistor Q4 is grounded.

The voltage output unit 3 includes an n-channel metal-oxide-semiconductor field effect transistor (NMOSFET) Q5 and a resistor R6. A gate of the NMOSFET Q5 is connected to the collectors of the transistors Q4 and Q2. A source of the NMOSFET Q5 is grounded. A drain of the NMOSFET Q5 is connected to the power supply Vcc via the resistor R6. The drain of the NMOSFET Q5 is also connected to the electronic device 5.

In other embodiments, the NMOSFET Q5 may be replaced by another type of electronic switch, such as an npn transistor. The npn transistors Q1-Q4 may be integrated in a chip. The npn transistors Q1-Q4 may be replaced by other types of electronic switches, such as NMOSFETs.

In use, when the device 5 is off and the bases of transistors Q1 and Q3 receive the first control signal Vcon, initiated by action of a user, separately via the resistors R1 and R4. When the first control signal Vcon changes to high level, the first control signal Vcon received by the transistor Q1 will be delayed by the delay unit 4. After the capacitor C1 is charged for a period of time, the transistor Q1 is turned on, the base of the transistor Q2 is at low level, and the transistor Q2 is turned off. The collector of the transistor Q2 is at high level. The first control signal Vcon turns on the transistor Q3. The base of the transistor Q4 is at low level, the transistor Q4 is turned off, and the collector of the transistor Q4 is at high level. Therefore, the gate of the NMOSFET Q5 is at high level, and the NMOSFET Q5 is turned on. A second control signal Vout, output by the drain of the NMOSFET Q5, is at low level, to turn on the electronic device 5 after a rising edge of the first control signal Vcon. When the first signal Vcon is changed to low level, by action of the user to turn the device 5 off, the transistor Q3 is turned off, the base of the transistor Q4 is at high level, the transistor Q4 is turned on, the collector of the transistor Q4 is at low level. The NMOSFET Q5 is turned off, the second control signal Vout is at high level, so as to shut off the electronic device 5 once a falling edge of the first control signal Vcon occurs.

Figure 2:
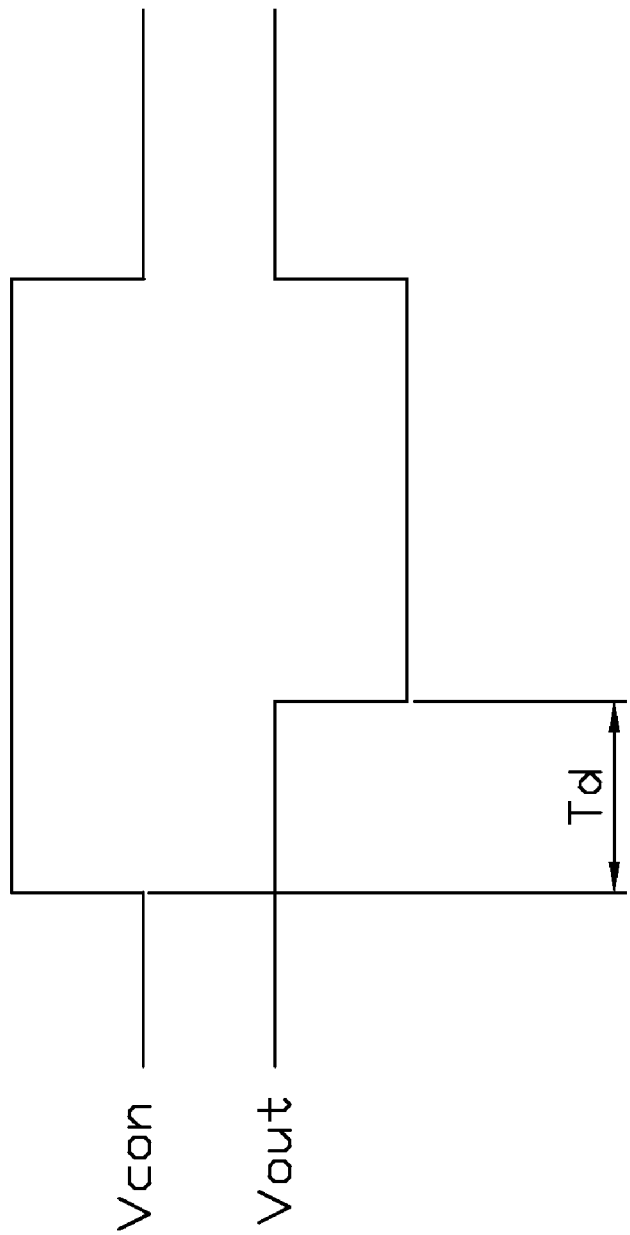
FIG. 2 is a time sequence curve of the circuit of FIG. 1.

Referring to FIG. 2, a falling edge of the second control signal Vout output by the drain of the NMOSFET Q5 is delayed for a period of time Td after the rising edge of the first control signal Vcon, and a rising edge of the second control signal Vout occurs nearly at the same time as the falling edge of the first control signal Vcon. The time Td is determined by values of the resistor R1 and the capacitor C1, which are chosen according to time sequence requirements.

In this embodiment, the first control signal Vcon may be generated by the south bridge of a computer motherboard, the control signal Vout is transmitted to a central processing unit of the computer motherboard, so as to turn on or turn off the computer motherboard.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A circuit for controlling time sequence of an electronic device, the circuit comprising:
    a delay unit to receive a first control signal to delay the first control signal for a period of time;
    a first switch unit connected to the delay unit, to receive the delayed first control signal;
    a second switch unit to receive the first control signal; and
    a voltage output unit connected to the first and second switch units, wherein the voltage output unit is controlled by the first switch unit to output a second control signal after a rising edge of the delayed first control signal, to turn on the electronic device; wherein the voltage output unit is controlled by the second switch unit to output a third control signal in response to a falling edge of the first control signal, to turn off the electronic device.

2. The circuit of claim 1, wherein the delay unit includes a first resistor and a capacitor, a first end of the resistor is configured to receive the first control signal, a second end of the resistor is grounded via the capacitor.

3. The circuit of claim 2, wherein the first switch unit includes a first and a second electronic switches, and a second and a third resistors, a first terminal of the first electronic switch is connected to a node between the first resistor and the capacitor, a second terminal of the first electronic switch is grounded, a third terminal of the first electronic switch is connected to a power supply via the second resistor; wherein a first terminal of the second electronic switch is connected to the third terminal of the first electronic switch, a second terminal of the second electronic switch is grounded, a third terminal of the second electronic switch is connected to the power supply via the third resistor, the first and second electronic switches are turned on in response to the third terminals of the first and second electronic switches being at high level.

4. The circuit of claim 3, wherein the first and second electronic switches are npn transistors, the first, the second, and the third terminals of the first and second switches correspond to bases, emitters, and collectors.

5. The circuit of claim 3, wherein the second switch unit includes a third and a fourth electronic switches, and a fourth and a fifth resistors, a first terminal of the third electronic switch is configured to receive the first control signal via the fourth resistor, a second terminal of the third electronic switch is grounded, a third terminal of the third electronic is connected to a power supply via the fifth resistor; wherein a first terminal of the fourth electronic switch is connected to the third terminal of the third electronic switch, a second terminal of the fourth electronic switch is grounded, a third terminal of the fourth electronic switch is connected to the third terminal of the second electronic switch, the third and fourth electronic switches are turned on in response to the third terminals of the third and fourth electronic switches being at high level.

6. The circuit of claim 5, wherein the third and fourth electronic switches are npn transistors, the first, the second, and the third terminals of the third and fourth electronic switches correspond to bases, emitters, and collectors.

7. The circuit of claim 5, wherein the voltage output unit includes a fifth electronic switch and a sixth resistor, a first terminal of the fifth electronic switch is connected to the third terminals of the second and fourth electronic switches, a second terminal of the fifth electronic switch is grounded, a third terminal of the fifth electronic switch is connected to the power supply via the sixth resistor; wherein the third terminal of the fifth electronic switch is connected to the electronic device to output the second or the third control signal, the fifth electronic switch are turned on in response to the third terminal of the fifth electronic switch being at high level.

8. The circuit of claim 7, wherein the fifth electronic switch is an n-channel metal oxide semiconductor field effect transistor, the first, second, and third terminals of the fifth electronic switch correspond to a gate, a source, and a drain.

9. A circuit for controlling time sequence of an electronic device, the circuit comprising:
a delay unit to receive a first control signal to delay the first control signal for a period of time;
a first switch unit connected to the delay unit to receive the delay first control signal, and output a first signal;
a second switch unit to receive the first control signal, and output a second signal; and
a voltage output unit connected to the first and second switch units to receive the first and second signals, and output a second control signal to the electronic device according to the first and second signals, wherein the voltage output unit is controlled by the first signal after a rising edge of the delayed first control signal to output the second control signal to turn on the electronic device, and the voltage output unit is controlled by the second signal in response to a falling edge of the first control signal to output the second control signal to turn off the electronic device, wherein a falling edge of the second control signal is delayed for a period of time after the rising edge of the first control signal, a rising edge of the second control signal occurs nearly at the same time as the falling edge of the first control signal.

* * * * *